(12) United States Patent
Ludikhuize

(10) Patent No.: US 8,022,506 B2
(45) Date of Patent: Sep. 20, 2011

(54) SOI DEVICE WITH MORE IMMUNITY FROM SUBSTRATE VOLTAGE

(75) Inventor: Adrianus W. Ludikhuize, Valkenswaard (NL)

(73) Assignee: NXP B.V., Eindhoven (NL)

( * ) Notice: Subject to any disclaimer, the term of this patent is extended or adjusted under 35 U.S.C. 154(b) by 449 days.

(21) Appl. No.: 11/813,018

(22) PCT Filed: Dec. 15, 2005

(86) PCT No.: PCT/IB2005/054268
§ 371 (c)(1),
(2), (4) Date: Nov. 30, 2009

(87) PCT Pub. No.: WO2006/070304
PCT Pub. Date: Jul. 6, 2006

(65) Prior Publication Data
US 2010/0065885 A1  Mar. 18, 2010

(30) Foreign Application Priority Data

Dec. 28, 2004  (EP) .................................... 04107009

(51) Int. Cl.
*H01L 29/66*  (2006.01)

(52) U.S. Cl. ................ 257/592; 257/133; 257/E29.187; 257/E29.19; 257/E21.373; 438/311; 438/350

(58) Field of Classification Search .................. 257/592, 257/133, E29.187, E29.19, E21.373; 438/311, 438/350
See application file for complete search history.

(56) References Cited

U.S. PATENT DOCUMENTS

| | | | |
|---|---|---|---|
| 5,166,767 A * | 11/1992 | Kapoor et al. | ................. 257/518 |
| 5,389,561 A | 2/1995 | Gomi | |
| 5,627,401 A | 5/1997 | Yallup | |
| 6,563,193 B1 | 5/2003 | Kawaguchi et al. | |
| 2004/0119091 A1 * | 6/2004 | Suzuki et al. | ................. 257/197 |

FOREIGN PATENT DOCUMENTS

WO  199632798 A1  10/1996

* cited by examiner

*Primary Examiner* — Tu-Tu Ho

(57) ABSTRACT

A semiconductor on insulator device has an insulator layer, an active layer (40) on the insulator layer, a lateral arrangement of collector (10), emitter (30) and base (20) on the active layer, and a high Base-dose region (70) extending under the emitter towards the insulator to suppress vertical current flowing under the emitter. This region (70) reduces the dependence of current-gain and other properties on the substrate (Handle-wafer) voltage. This region can be formed of the same doping type as the base, but having a stronger doping. It can be formed by masked alignment in the same step as an n type layer used as the body for a P-type DMOS transistor.

16 Claims, 9 Drawing Sheets

SOI DEVICE WITH MORE IMMUNITY FROM SUBSTRATE VOLTAGE

This invention relates to semiconductor on insulator, especially Silicon on Insulator (SOI) semiconductor devices and methods of manufacturing the same.

It is known to manufacture integrated circuits in SOI to exploit advantages such as increased tolerance for radiation and extreme temperatures. This is made possible by a layer of insulating material that protects the circuit itself from interference and parasitic effects. SOI has other advantages, such as more output-power for a given power consumption. SOI-based components have been used in applications such as audio amplifiers and high-performance servers where low power-dissipation is vital. An example of SOI is used in Advanced Bipolar-CMOS-DMOS (A-BCD) technology developed by the applicant Philips. This is a single poly, double or triple metal technology, designed for applications from 12 V to 120 V, and capable of combining bipolar, JFET, CMOS and DMOS on a single-chip. This means that SOI A-BCD can handle analog and digital power simultaneously, making optimized system solutions possible such as combinations of DSP and D/A and A/D converters.

Key advantages include:
a) reduced resistance when the transistor is on (RDS(on))
b) no latch-up (where the transistors effectively get 'stuck' in the on-state)
c) much better packing densities
d) significantly reduced parasitic capacitances and currents.

These four factors lead to numerous consequential advantages. Firstly, by decreasing the on-resistance (RDS-on) by up to 20%, A-BCD1 generates less heat than equivalent bulk silicon processes, meaning they can be fixed directly to the PCBs in TVs or computers, without heat-sinks. And with this low RDS-on, SOI enables DMOS transistors with excellent power handling capabilities.

Secondly, with no junctions between the n- and p-type devices and the substrate, SOI is intrinsically free from latch-up (associated with the overloading of bulk silicon transistors) and virtually eliminates problems arising from cross-talk via the substrate, load dump and other accidental high external voltages. These features make SOI inherently more reliable and also allow for easy integration of multiple power devices, bridge rectifiers and fly-back diodes on the same piece of silicon. By combining CMOS, Bipolar, JFET and DMOS SOI devices, smart power circuits can be realised.

Thirdly, the packing densities achieved by SOI enable size reductions of up to 30% compared to bulk silicon, which in turn contributes to even lower RDS-on. This is further exploited by next-generation A-BCD high-voltage technology.

Lastly, the isolation of the components in the oxide layer helps ensure excellent insulation and, as a result, a significant reduction in parasitic capacitances and currents, leading to quicker and easier design-in. Eliminating latch-up and parasitics provides protection from voltage spikes and improved audio performance. Because A-BCD does not need reverse-biased junctions to isolate components, leakage currents are avoided, leading to greater heat tolerance, up to 160° C. instead of the normal 125° C. for bulk silicon. It is known from U.S. Pat. No. 5,627,401 to provide an SOI bipolar transistor with a lateral arrangement of base, collector and emitter. A collector-base depletion region normally supports most of the voltage across the device. To address the problem of large variation in width of this region as the voltage varies, causing variations in base charge, a back gate (substrate, handle wafer) contact is used to apply a bias voltage to the substrate below the oxide layer. This causes and controls an inversion or depletion layer adjacent to the insulator which modifies the collector region and can reduce the base charge sensitivity to voltage across the device.

It is known from U.S. Pat. No. 6,563,193 to provide an SOI layer with an n type active high resistance layer above the oxide, and an n-type diffusion layer above the active high resistance layer, in which are formed the base, collector and emitter regions. If in such a structure, a p-type inversion layer forms at the interface of the oxide layer and the high resistance active layer, it causes gain to vary with substrate voltage. To mitigate this, the n-type diffusion layer is selectively formed on the surface of the n-type active layer in such a manner that the layer surrounds only the emitter and base regions rather than also surrounding the collector region. This means that the total n-type impurity concentration on the surface portion of the n-type active layer around the p-type emitter layer is lower than with a full n-type active layer including the collector. As a consequence, an emitter current (a hole current) can more easily flow in the vicinity of the surface of the n-type active layer. Thus, even in the case where an inversion layer is formed in depth at the buried oxide, the emitter current which flows via this inversion layer is relatively suppressed. Consequently, the problem that the current-gain hFE depends on the potential of the semiconductor substrate can be suppressed.

There remains a need for SOI devices with good current gain with less dependence on the voltage or charging of the substrate under the oxide layer.

An object of the invention is to provide improved apparatus or methods especially for semiconductor on insulator, especially Silicon on Insulator (SOI) semiconductor devices and methods of manufacturing the same. An advantage of the present invention is the provision of SOI devices with good current gain with less dependence on the voltage or charging of the substrate under the oxide layer as well as method of making the same.

According to a first aspect, the present invention provides a semiconductor on insulator device having an insulator layer, an active layer of a first conductivity type on the insulator layer, a collector region of a second conductivity type, an emitter region of a second conductivity type and a base region of a first conductivity type all arranged in the active layer, and a base boost region of a first conductivity type in the active layer extending from the emitter region to the insulator layer, the base boost region forming with the emitter a pn junction, whereby the dopant concentration of the base boost region is higher than that of the base region.

The base boost region under the emitter region has a higher dopant concentration than the base region. The bottom part of the emitter-base junction, which is a pn-junction, has a higher built-in voltage than the built-in voltage in the lateral direction. If the emitter-base junction is forward biased, charge carriers are injected from the emitter into the base. Because of the lower built in voltage in the lateral direction almost all charge carriers will be injected from the emitter into the base over the lower barrier of the peripheral part of the emitter-base junction. Because of an exponential relationship between the current and the built in voltage, almost all current will flow in the lateral direction. Therefore, the higher dopant concentration in the base boost region under the emitter suppresses the vertical current under the emitter very effectively.

The base boost region extends from the bottom part of the emitter to the insulating layer in order to suppress the vertical current and the dependence of the current on the potential of the substrate (often called handle wafer) below the buried oxide. In high voltage processes, the potential of the substrate can change easily. If an inversion layer is formed in the active layer (above the surface of the insulating layer), this inversion layer effectively functions as a collector. The relatively high dopant concentration in the base boost region increases the threshold for inversion. The deeper the base boost region, the larger is the base width between the emitter and inversion layer, so that the vertical current is even further suppressed. This in turn reduces the dependence of the current-gain and other properties on the substrate voltage.

Preferably, the base boost region does not extend laterally beyond the extent of the emitter region. The higher dopant concentration in the base boost region locally under the emitter suppresses the vertical current under the emitter very effectively. As an advantage, the emitter current flows almost entirely in the lateral direction. The lateral current is higher than in case the base boost region extends laterally beyond the emitter region. As a consequence, a higher current gain can be obtained.

In an advantageous embodiment the base boost region has a 5 to 10 times higher dopant concentration than the base region. Besides the effect of the higher built in voltage at the bottom part of the emitter-base junction, the emitter-current is roughly inversely proportional to the dopant concentration in the base region. A 5 to 10 times higher dopant concentration in the base region therefore further reduces the vertical emitter current with a factor 5 to 10.

The current in the lateral direction is not influenced, so that the current gain and other properties are decoupled from the influence of the substrate voltage. For instance the current gain becomes almost independent on the voltage of the substrate (handle wafer).

In an advantageous embodiment the device according to the invention is a bipolar transistor in an Advanced Bipolar CMOS DMOS process. Such a circuit comprises besides Bipolar devices also CMOS and/or DMOS devices. The Bipolar device may be a PNP transistor, being part of an SOI IC-process providing CMOS, high-voltage N-ch and P-ch DMOS and NPN transistors.

Preferably there is a patterned conductive (e.g. a doped poly-silicon) layer extending on an insulating layer on the active layer around the emitter region. The patterned conductive layer can function as a mask for ion implantation of the emitter and also of the base boost region. Another advantage is that it can be easier to manufacture this base boost region since the mask-alignment to the emitter has no effect: the lateral current-gain is not much changed and it has a better reproduction.

The patterned conductive layer may be electrically connected to the base region. The potential of the patterned conductive layer remains the same as the potential of the base.

The base boost region can be manufactured without any additional costs when a DMOS device of the right type is already made in an A-BCD process. The base boost region is manufactured at the same time as the body region of the DMOS device. Consequently, the dopant profile of the base boost region has the same dopant profile as the body region of the DMOS device. For a p-type DMOS, an n-type body region is used. The n-type body region is manufactured self-aligned to a patterned conductive layer (usually a poly-silicon field plate, which is the gate for the DMOS device). The emitter is also self-aligned to the poly-silicon field plate.

The (lateral) base region can be manufactured at the same time as the well (drain) of another DMOS device. The base region than has the same dopant profile as the well (drain) of the DMOS device.

The emitter can be manufactured at the same time as the source of the DMOS device. The emitter region than has the same dopant profile as the source of the DMOS device.

Another aspect of the invention provides a method of manufacturing a semiconductor on insulator device, comprising the steps of forming an insulator layer, forming an active layer on the insulator layer, forming in the active layer a collector region, an emitter region and a base region, and forming a base boost region in the active layer extending from the emitter region to the insulator layer, the base boost region forming with the emitter a pn junction, whereby the dopant concentration of the base boost region is higher than that of the base region.

In an advantageous embodiment of the method, the base boost region is manufactured in such a way that the base boost region does not extend laterally beyond the extent of the emitter. The base boost region may be formed by providing dopant atoms during epitaxial growth, or by means of an ion implantation step.

Another such additional feature is the step of forming the base boost region comprising carrying out a doping stronger than a doping of the base region by typically between 5 and 10 times. The dopant concentration (atoms/cm$^3$) can be provided by ion implantation.

Preferably the base boost region is formed using a self-aligning step.

A patterned polysilicon layer on the active layer can be provided around the emitter, functioning as a mask when the base boost region is implanted with ions.

The base region can be formed by ion implantation in the active layer, which ion implantation is the same as a well implantation of a MOS or DMOS device which is manufactured at the same time.

The base boost region can be formed at the same time as a body region of a DMOS device.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which.

Figure 1:
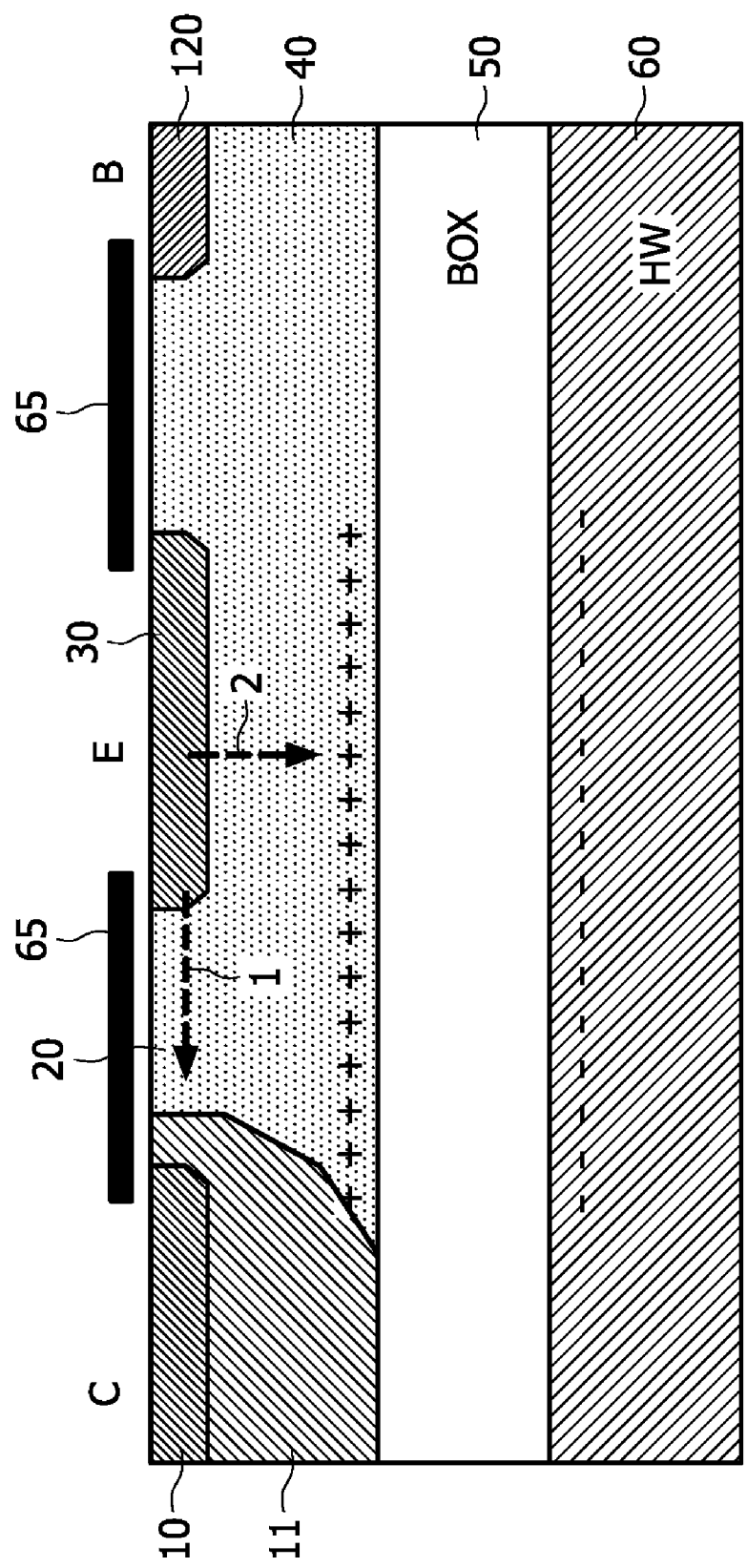
FIG. 1 shows a cross section of a device with a conventional construction.
Figure 3:
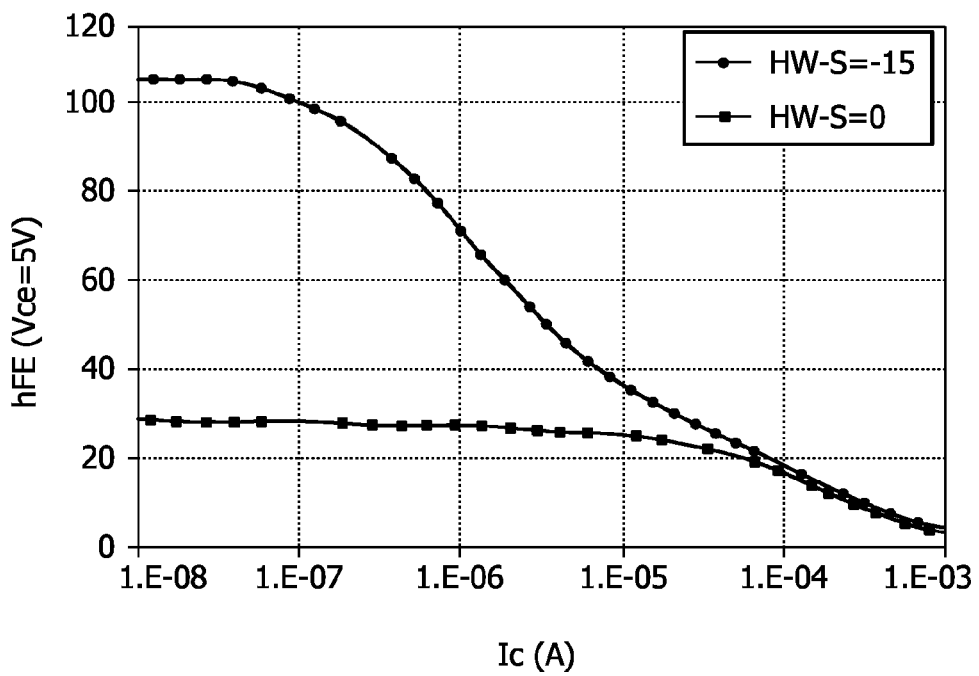
Figure 4:
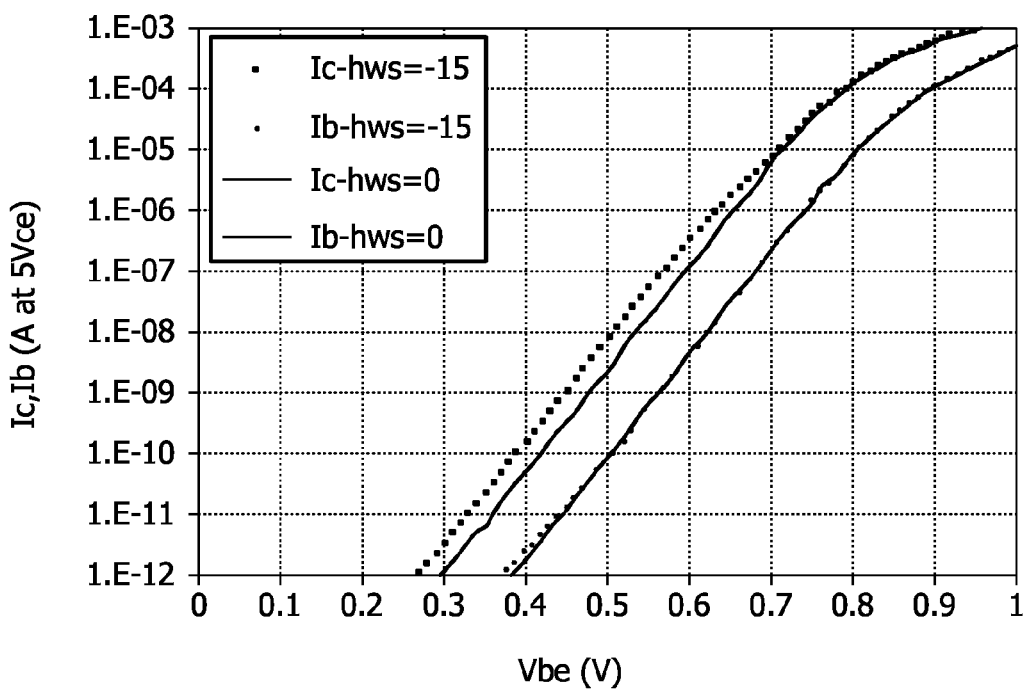
Figure 5:
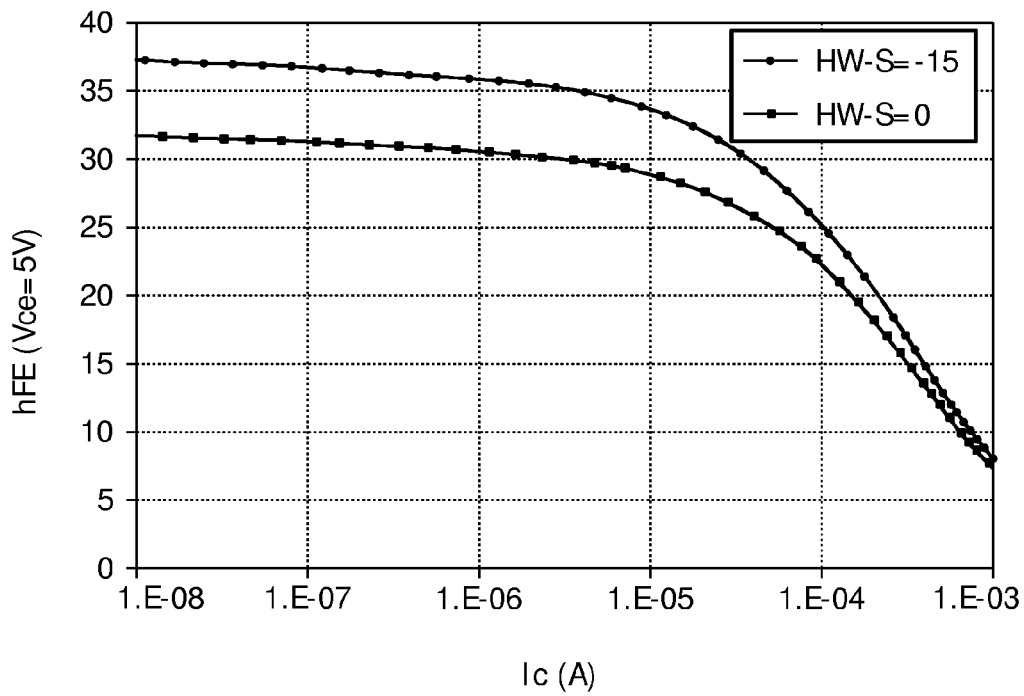
Figure 6:
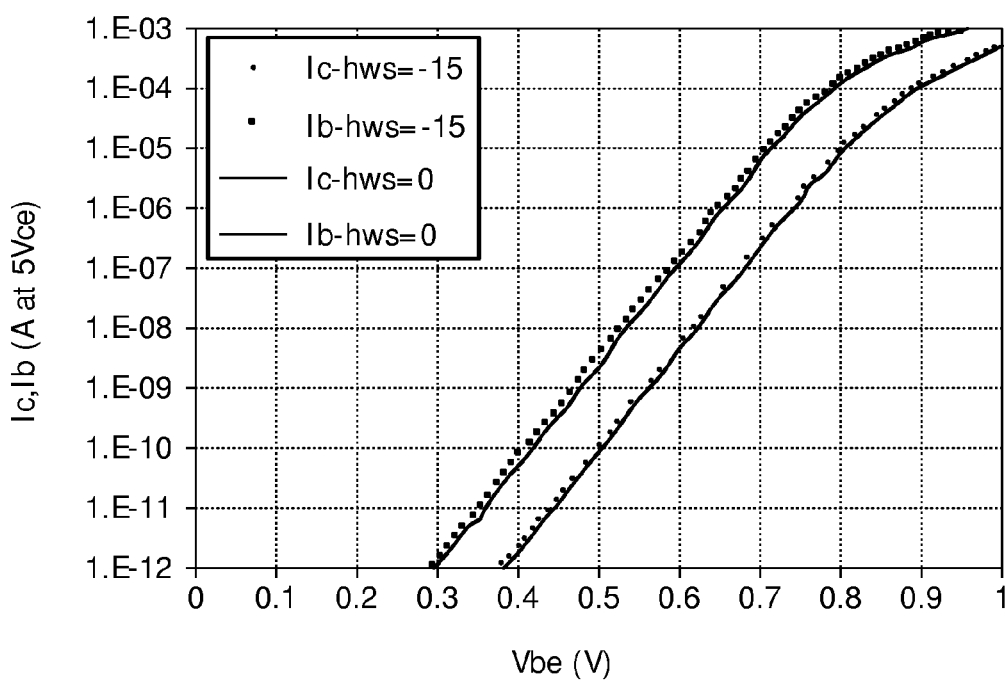
Figure 7:
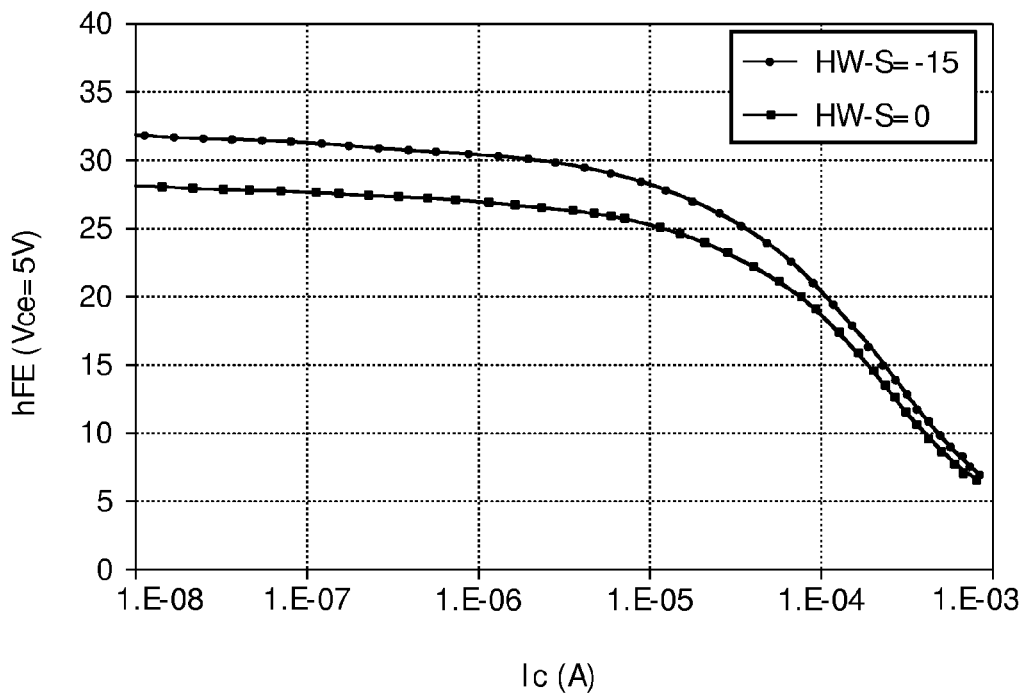
Figure 8:
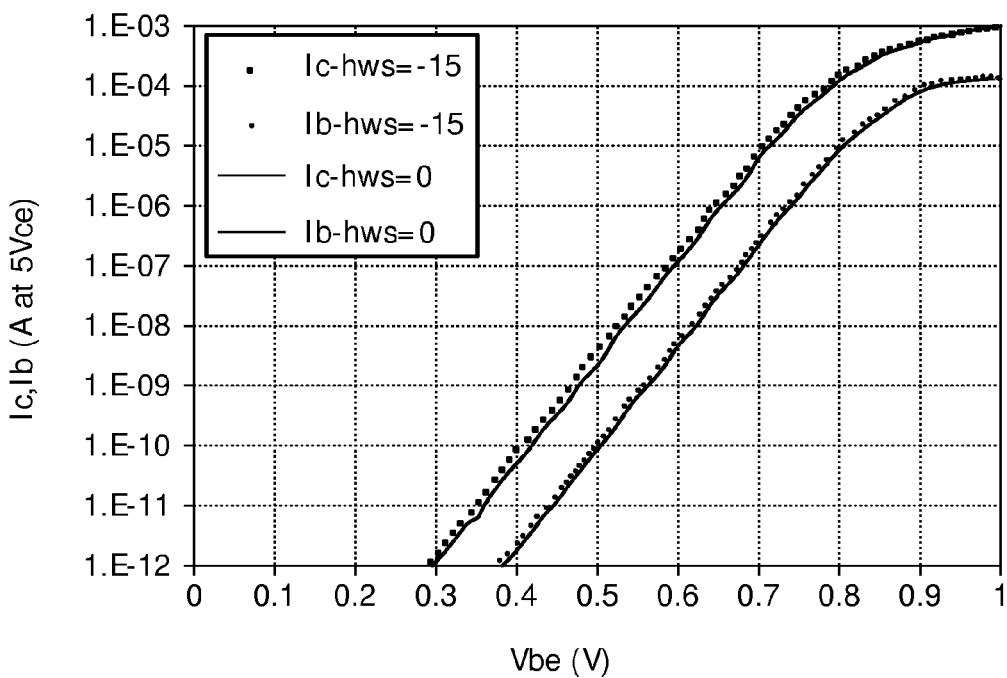

FIGS. 3 and 4 show graphs of performance of the known prior art device of FIG. 1, FIGS. 5 and 6 show graphs of performance of a first embodiment of the invention, and FIGS. 7 and 8 show graphs of performance of a second embodiment of the invention.

The present invention will be described with respect to particular embodiments and with reference to certain drawings but the invention is not limited thereto but only by the claims. Any reference signs in the claims shall not be construed as limiting the scope of the invention. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Moreover, it is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Where an indefinite or definite article is used when referring to a singular noun e.g. "a" or "an", "the", this includes a plural of that noun unless something else is specifically stated.

For reference, to compare to the first embodiment of the invention, an example of a conventional construction will be described first, with reference to FIG. 1.

An example of a prior art PNP-transistor in thin-layer SOI (here from the Philips A-BCD family) is shown schematically in FIG. 1. It shows a collector 10 (having only the first region close to the surface), a base 20, and an emitter 30, formed in an area of semiconductor 40 on top of a buried oxide layer 50. This is in turn formed on top of a substrate 60 in the form of a handle wafer I-W. A poly Si-plate 65 is shown on the top surface on an insulator as a spacer and field-plate, connected to the base. This arrangement normally uses the lightly-doped N-well as used for PMOS transistors and for the drift region of HV n-type DMOS transistors (not shown) as active base for a good current gain. This gives transistors that perform well with good current gain. A problem is, however, that some of the properties (current-gain, collector-current, Early voltage) depend on the voltage of device to the handle wafer 60 (HW; substrate under the buried oxide). This is because in fact two transistors contribute: a lateral transistor with current flow shown by arrow (1) through the lateral base to the lateral collector, and a vertical transistor with current flow shown by arrow (2) where the collector location depends on the HW-voltage. If the HW-potential is low (negative as compared to emitter/base, as for a PNP is normally the case), a p-type inversion-layer is built up, which acts as a nearby collector for the vertical transistor at sufficient collector voltage (see 'kink' as described in U.S. Pat. No. 6,563,193, FIG. 4), thus making this transistor more effective. The shallow collector (10) limits the Vce-voltage to about 10V. For higher collector-to-base voltage ratings the collector should be lighter doped and is generally deeper, extending down to the buried oxide (11). This makes the vertical transistor-action even stronger (no 'kink' but extra current immediately starting from low Vce). It also makes access to the base more difficult. In some examples, the collector surrounds the base now only by 75%, in order to have a good access to the Base.

Types for e.g. 18V have a deep-p collector with a lighter dopant concentration, extending under the PolySi plate 65 (FIG. 1, 11, the deep part of 10); in the process one can use here the p-type body of an available n-type DMOS transistor. For still higher voltages (e.g. 36V) an available P-well under Locos is used as the collector (FIG. 2E). In both cases the deep p-collector down to the buried oxide tends to enhance the influence of the vertical transistor. When the HW voltage is below Emitter or Base voltage an inversion-layer is induced which activates the vertical transistor. Unfortunately this operation-mode is the normal (high-side) mode for a PNP-transistor.

Figure 2A:
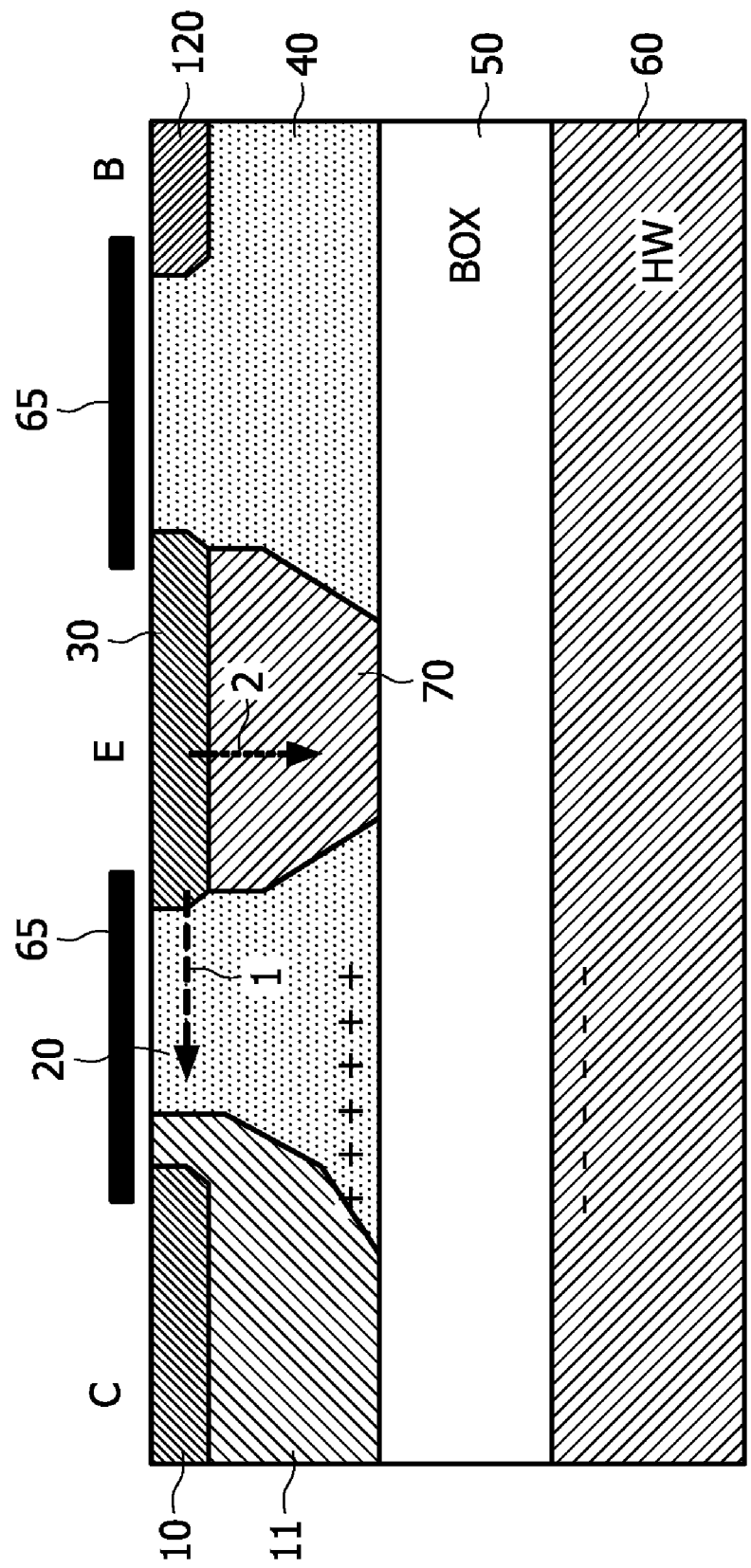
FIG. 2A shows a cross section of a device according to a first embodiment, having the base boost region extending between the emitter and the insulating layer.

FIG. 2A shows a cross section of a first embodiment of the invention. The PNP-transistor in thin-layer SOI is similar to that of FIG. 1 (and corresponding reference numerals have been used as appropriate and relate to elements with similar functions) but it is provided with a doped base-boost region 70 locally under the emitter with the same n-type dope as the base. This region has a high Base-dose (dope times thickness) and so reduces current (2) from the emitter 30 to the inversion layer above the insulator layer 50, and so the vertical transistor is suppressed. It is better if this region is limited so as not to extend to the sides of the emitter region, and maintain the normal lateral current (1) for a high current-gain.

Figure 2B:
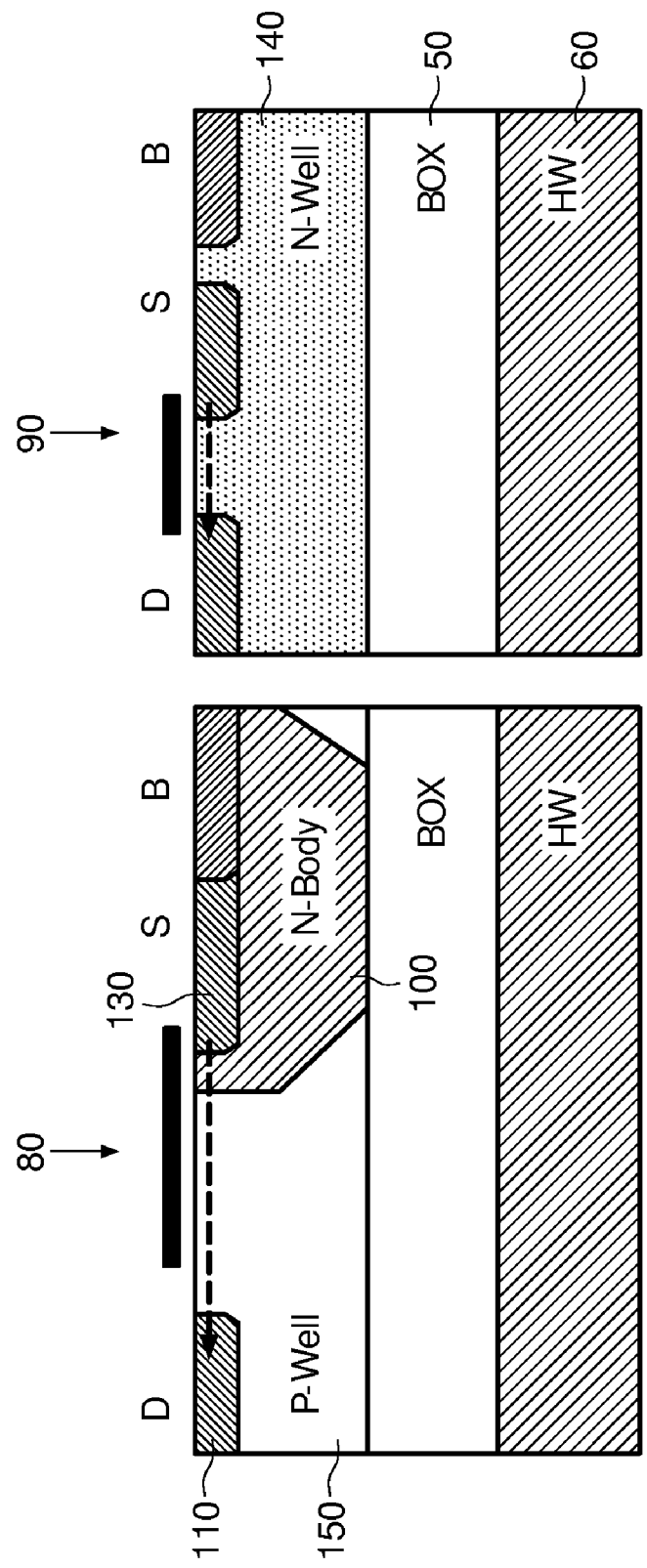
FIG. 2B shows a cross section of a P-LDMOST and a PMOST integrated with the device according to the invention.

There are a number of ways to incorporate this new region into the manufacturing process. In several A-BCD processes a suitable layer is the n-type body-region for the p-type DMOS transistor already present in the process, having about 5-10× the N-well dose. An example of a co-integrated P-LD-MOST (with an n-type body region) and a PMOST (in an N-Well) are shown in FIG. 2B. In the manufacture of the base boost region 70 for the PNP transistor, the N-type body implantation and diffusion can be used. Accordingly there is no need for the expense of an additional processing step.

In this example the dopant concentration of the base is about $10^{16}$ at/cm$^3$. The implantation of the base boost is about $2 \times 10^{13}$ at/cm$^2$ phosphorous, resulting in an n-type dopant concentration of about $10^{17}$ at/cm$^3$ locally below the emitter 30. The distance between the bottom of the emitter and the insulator layer 50 is about 1 micron. The distance between the emitter and the collector is about 2 micron. This implantation is applied with mask-alignment under the p+ emitter; it reduces the gain of the vertical transistor and hence reduces the influence of the HW-voltage as discussed above.

Figure 2C:
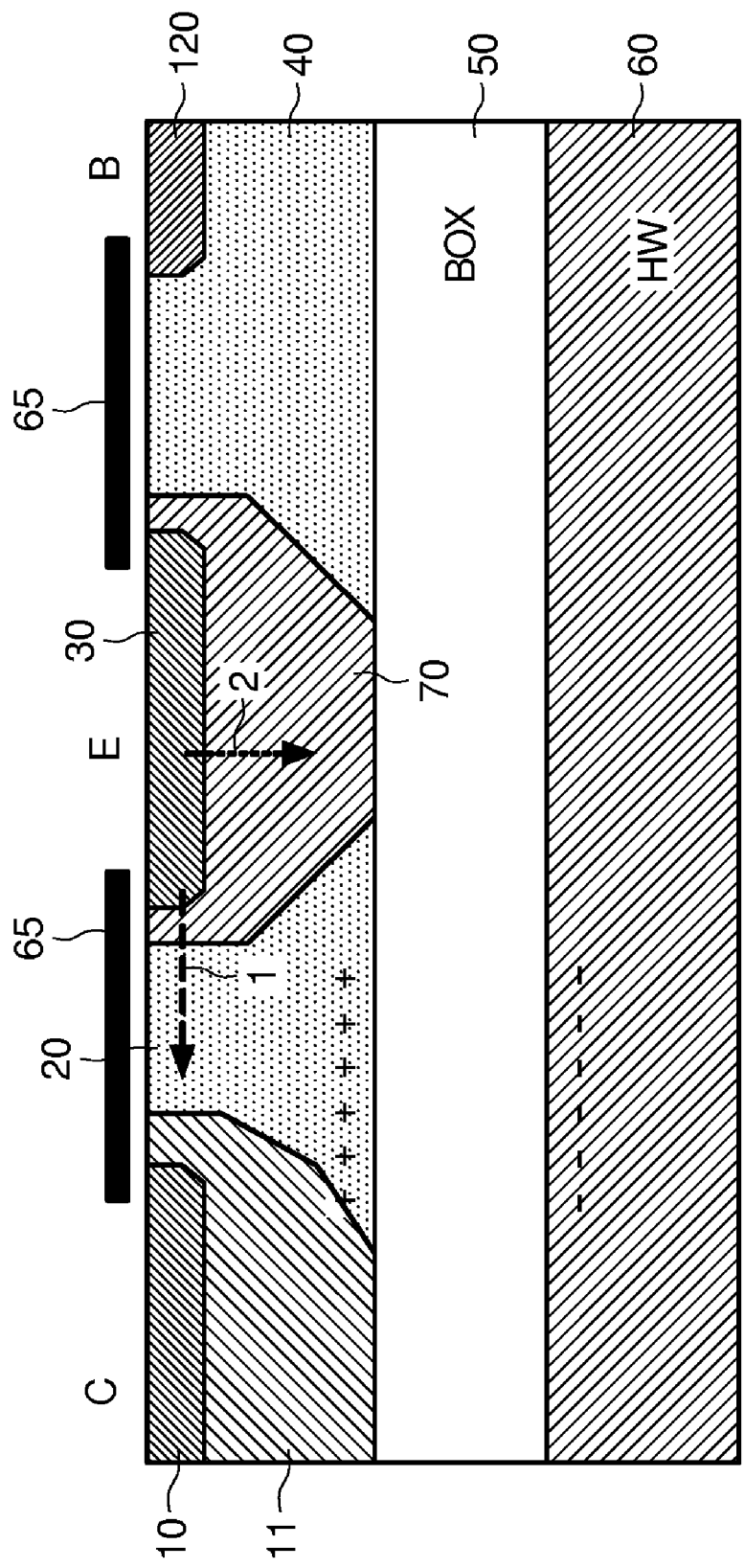
FIG. 2C shows a cross section of a device according to a second embodiment.

FIG. 2C shows in a second embodiment a lateral PNP transistor in SOI with a self-aligned n-region 70 under the emitter to suppress a vertical current. In the manufacture of respectively the Base 20 and Emitter 30 of this PNP transistor, a self-aligned n-type body 100 and shallow p+ source 130 combination of implantations and diffusions is used as is carried out in the p-type LDMOS 80 of FIG. 2B. This brings much more dopant atoms under the emitter (for reduced vertical current) and only a low and well-determined fraction of it besides the emitter (yielding an about normal lateral current). In the lateral direction the base boost top dopant concentration is in this example about $4 \times 10^{16}$ at/cm$^3$. In the vertical direction the dopant concentration below the emitter is about $10^{17}$ at/cm$^3$ (the distance between the emitter and the insulator layer being again about 1 micron).

Figure 2D:
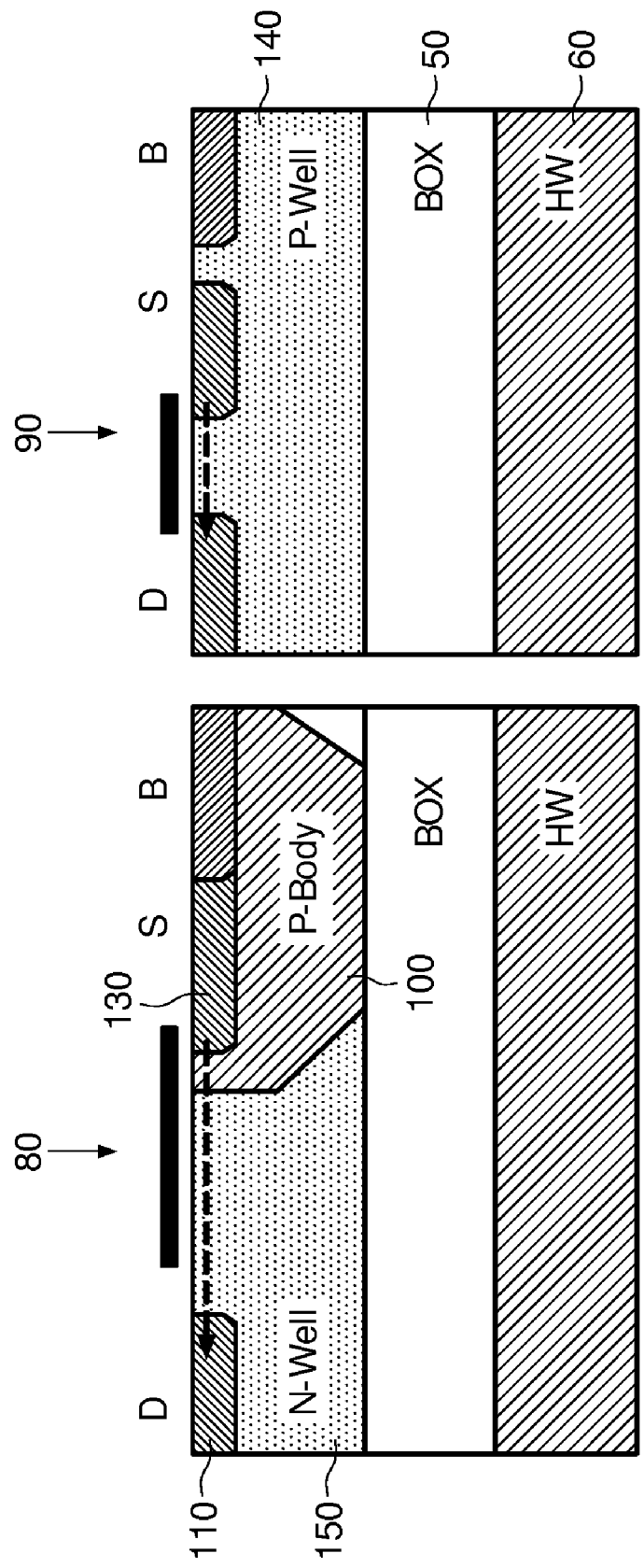
FIG. 2D shows a cross section of a N-LDMOST and a NMOST integrated with the device according to the invention.
Figure 2E:
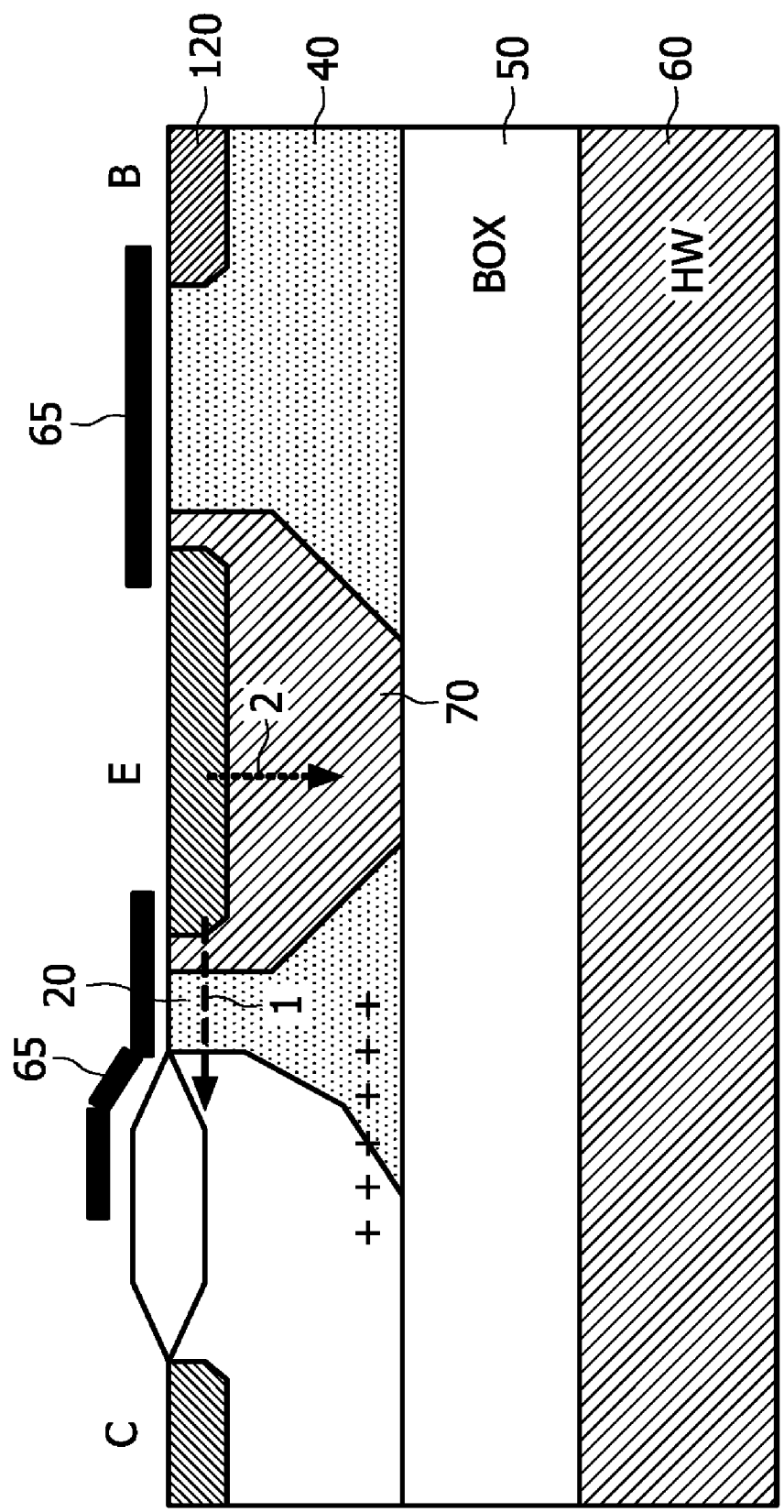
FIG. 2E shows a cross section of a device according to an alternative second embodiment, suitable for higher collector-emitter voltage (VCE).

For an NPN-transistor it is known that such a self-aligned emitter and base can be manufactured by using the p-type body 100 and shallow n+ source 130 combination of implantations and diffusions of an n-type LDMOS 80 (see left-hand side of FIG. 2D); here the HW-effect is not very strong.

In practice, it was found that a PNP-transistor with a self-aligned p+-type emitter and N-type body like in a P-type LDMOST did not have such good performance in terms of punch-through if placed in the available P-well for the HV-collector. But in combination with a local P-well collector, the punch-through effect could be reduced. Thus there is not much vertical transistor-current, most of the transistor current flows in the lateral direction. Hence the new base construction can be implemented without major adjustments to the existing manufacturing processes for PNP-transistor designs, like in Philips A-BCD SOI-processes.

Here 18V-types have a p-type body from the n-LDMOS body for the collector (See FIG. 2A, 2C), whereas 36V types have a local P-well under Locos for the collector (see FIG. 2E). These embodiments can be used in the A-BCD type devices described above or in other types of devices.

In FIGS. 3 to 10 the electrical performance of the devices mentioned above are shown.

Examples of the effect on the current gain versus HW-voltage, and a Gummel plot (providing log-Ic and log-Ib versus Vbe) are shown in the graphs, for 3 devices:

FIGS. 3 and 4: for a prior art conventional PNP transistor in SOI with n-layer (lightly-doped N-well,) only with shallow p+ emitter in the n-layer base (FIG. 1), a PolySi-layer 65, functioning as spacer, is connected to the base contact region 120, and a shallow p+ collector for a Vce-max of about 10V.

FIGS. 5 and 6: for a PNP according to the first embodiment with an aligned n-boost dot under the p+ emitter (FIG. 2A), placed in n-layer base; A PolySi-spacer is connected to the base, a deep p-type body functions as collector (11) with a p+ contact at some distance, for a Vce-max above 18V.

FIGS. 7 and 8: for a PNP according to the second embodiment with self-aligned n-boost base and p+ emitter (like in a p-type LDMOST), placed in an adapted P-well under Locos as collector. A Poly-spacer (stepping on LOCOS) is connected to the base, A P-Well-collector is present under Locos having a remote p+ contact, for a Vce-max above 36V.

First the prior art of FIG. 3 and FIG. 4 will be discussed.

FIG. 3 shows two lines indicating how the current gain varies with collector current, one for zero HW voltage, and another for HW voltage of −15V. The gain varies between approximately 20 and 105 in the latter case, while it varies between approximately 20 and 30 in the former case. The difference is particularly marked for collector currents<10 µA.

FIG. 4 shows a Gummel plot (providing log-Ic and log-Ib versus Vbe) for the same device. This shows how collector current and base current vary with base-emitter voltage (the current-gain is Ic/Ib). There are four lines, two for zero HW voltage and two for HW voltage of −15V. The collector current can be seen to be increased by approximately a factor of 2 or more for the HW voltage of −15V over much of the lower range of base emitter voltage; this is due to the extra contribution (2) at HW=−15V (to emitter)

Thus the HW-effect is mainly seen in the Ic characteristic (see Gummel plots) and is very strong for the transistor with n-layer base only. This has to do with extra vertical collector-current to the depletion-region at the Buried-Oxide (BOX); the base-current remains unchanged. The effect also causes a poor Early-voltage if Vhw-to-emitter is not constant but changes equal to Vce, as can happen at the normal ('high side') use of a PNP device.

In the embodiments according to the invention, these effects are much reduced by using a base boost region 70 under the emitter (construction of FIG. 2A, FIG. 2C, FIG. 2E) as shown in FIGS. 5-8. FIGS. 5 and 6 show corresponding graphs for a first embodiment of the invention (FIG. 2A). In this case, the lines for HW=0V are much closer to the lines for HW=−15V with current-gain varying only from 32 to 37 at low current.

Similarly for a second embodiment (FIG. 2C) with self-aligned n-body/base and p+ source/emitter layer and with P-well collector and higher voltage-rating, the HW-effect is shown to be small by the graphs in FIGS. 7 and 8.

CONCLUDING REMARKS

As described above, a semiconductor-on-insulator device has an insulator layer, an active layer on the insulator layer, a lateral arrangement of collector, emitter and base on the active layer, and a high base-dose region extending under the emitter towards the insulator to suppress a vertical current flowing under the emitter. This reduces the dependence of current-gain and other properties on the substrate (Handle-wafer) voltage. This region can be formed of the same doping type as the base, but having a stronger doping. It can be formed mask-aligned under the emitter in the same step as an n type layer used as the body for a P-type DMOS transistor. Or it can be formed by a self-aligned n-type body-layer and source as is carried out in a p-type LDMOS transistor under and somewhat besides the emitter. Other variations can be conceived and are intended to be within the scope of the claims.

The invention claimed is:

1. A semiconductor on insulator device comprising:
an insulator layer,
an active layer of a first conductivity type on the insulator layer,
a collector region of a second conductivity type,
an emitter region of a second conductivity type and a base region of a first conductivity type all arranged in the active layer, and
a base boost region of a first conductivity type in the active layer extending from the emitter region to the insulator layer, the base boost region forming with the emitter a pn junction, whereby the dopant concentration of the base boost region is higher than that of the base region; and wherein the base boost region does not extend laterally beyond the extent of the emitter region.

2. The device of claim 1, wherein the base boost region has a 5 to 10 times higher dopant concentration than that of the base region.

3. The device of claim 1, comprising a CMOS and/or a DMOS device.

4. The device of claim 1, in which a patterned conductive layer is present on an insulating layer on the active layer, which patterned conductive layer extends around the emitter region.

5. The device of claim 1, in which the patterned conductive layer is electrically connected to a base contact region.

6. The device of claim 3, the base boost region having the same dopant profile as that of a body region of the DMOS device of equal conductivity type.

7. The device of claim 3, including a base contact region having the same dopant profile as that of a drain of the DMOS device of complementary conductivity type.

8. The device of claim 3, the emitter region having the same dopant profile as that of a source of the DMOS device of equal conductivity type.

9. A method of manufacturing a semiconductor on insulator device, comprising:
    forming an insulator layer;
    forming an active layer on the insulator layer;
    forming in the active layer a collector region, an emitter region and a base region; and
    forming a base boost region in the active layer extending from the emitter region to the insulator layer, the base boost region forming with the emitter a pn junction, whereby the dopant concentration of the base boost region is higher than that of the base region; and
    wherein the base boost region does not laterally extends beyond the extent of the emitter region.

10. The method of claim 9 wherein, forming the base boost region comprises carrying out a doping stronger than a doping of the base region by between 5 and 10 times.

11. The method of claim 9 wherein, the base boost region is formed using a self-aligning step.

12. The method as claimed in claim 11, wherein a patterned polysilicon layer on the active layer is provided around the emitter, functioning as a mask when the base boost region is implanted with ions.

13. The method of claim 9 wherein, the base region is formed by ion implantation in the active layer, said ion implantation is the same as a well implantation of a MOS or DMOS device which is manufactured at the same time.

14. The method of claim 13, having the step of forming the base boost region at the same time as a body region of the DMOS device.

15. The method of claim 13, and forming the emitter region in the same step as a source of the DMOS device.

16. The method of claim 9 wherein, the collector is placed in a well of opposite conductivity type to that of the base region.

* * * * *